United States Patent
Tregilgas et al.

[11] Patent Number: 5,942,054
[45] Date of Patent: Aug. 24, 1999

[54] MICROMECHANICAL DEVICE WITH REDUCED LOAD RELAXATION

[75] Inventors: John Harold Tregilgas, Dallas; Richard Lee Knipe, McKinney; Thomas William Orent, Garland, all of Tex.; Hidekazu Yoshihara, Tsukuba, Japan; Elliott Keith Carpenter, Lewisville, Tex.

[73] Assignee: Texas Instruments Incorporated, Dallas, Tex.

[21] Appl. No.: 08/772,588

[22] Filed: Dec. 20, 1996

[51] Int. Cl.$^6$ ................................................. C22C 45/08
[52] U.S. Cl. .......................... 148/403; 148/437; 420/552
[58] Field of Search ................................ 148/403, 415, 148/437; 420/548, 552; 423/385, 600

[56] References Cited

U.S. PATENT DOCUMENTS

| | | | |
|---|---|---|---|
| 4,837,094 | 6/1989 | Kudo | 148/403 |
| 5,061,049 | 10/1991 | Hornbeck | 359/224 |
| 5,413,974 | 5/1995 | Yokoyama et al. | 423/600 |
| 5,552,924 | 9/1996 | Tregilgas | 359/224 |

*Primary Examiner*—George Wyszomierski
*Attorney, Agent, or Firm*—Charles A. Brill; Frederick J. Telecky, Jr.; Richard L. Donaldson

[57] ABSTRACT

An improved elastic member (24) for micromechanical devices (12). The micromechanical device (12) includes a stationary member (28) and a moving member (26) which are connected together by a elastic member (24). Because of repeated and frequent movement of the moving member (26), the elastic member (24) can become permanently flexed or deformed, resulting in poor operation of the device. Aluminum alloys are formed to include oxygen, in combination with nitrogen if desired, to obtain a film with dramatically reduced load relaxation characteristics. Oxygen is added to an Argon sputter gas during deposition, and an amorphous film is produced.

5 Claims, 4 Drawing Sheets

UT LOAD RELAXATION DATA IN TiAl3(OxNy)

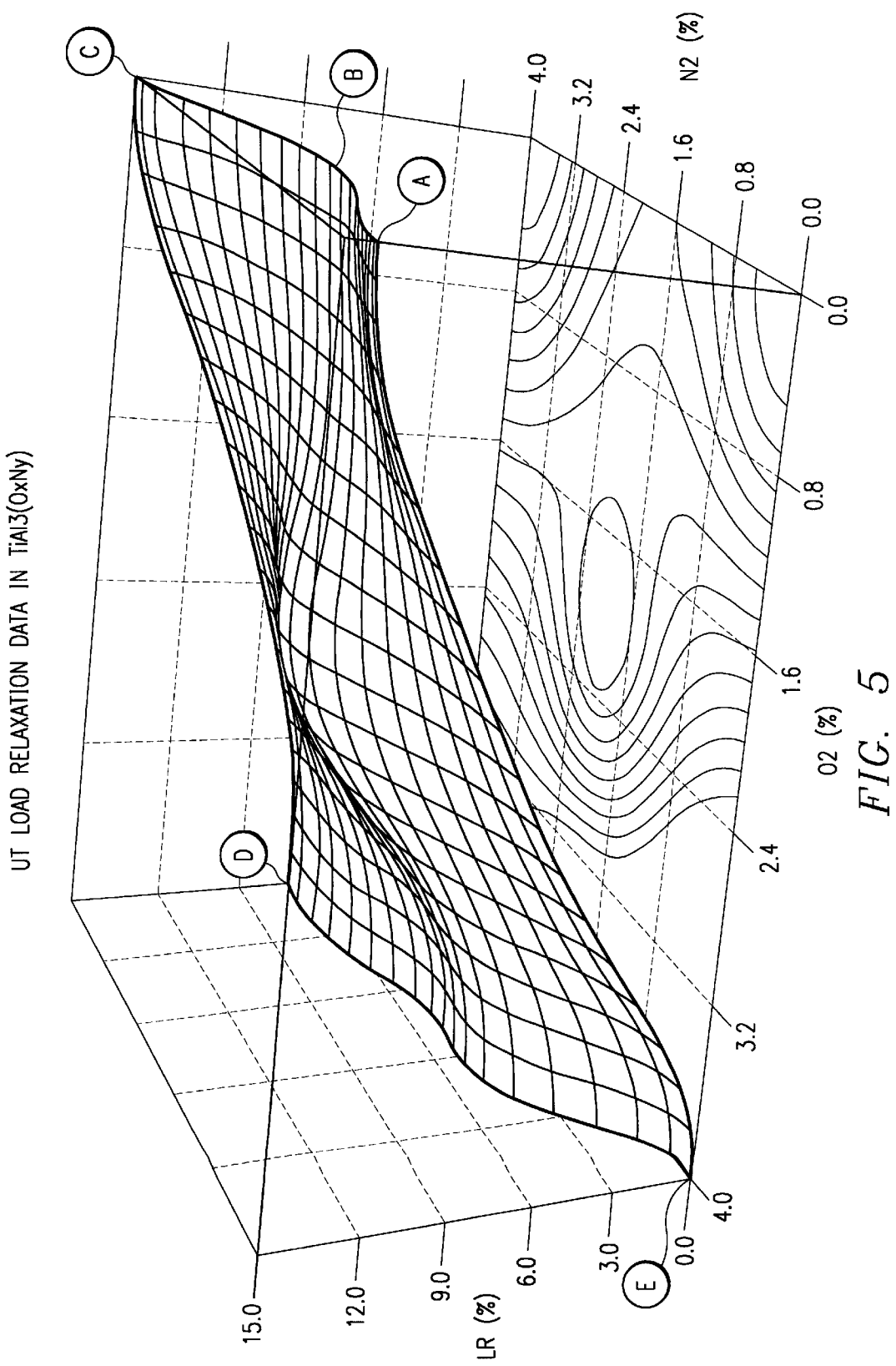

MICROMECHANICAL DEVICE WITH REDUCED LOAD RELAXATION

CROSS REFERENCE TO RELATED APPLICATION

Cross Reference is made to commonly assigned patent application Ser. No. 08/706,374 filed Aug. 30, 1996, entitled "Improved Elastic Member for Micromechanical Device", the teachings incorporated herein by reference.

FIELD OF THE INVENTION

This invention relates generally to micromechanical devices, and more particularly to micromechanical device hinges and elastic members.

BACKGROUND OF THE INVENTION

Micromechanical devices generally include miniature devices manufactured upon a substrate with moving parts. One example of such a device is the digital micromirror device, or DMD, manufactured by Texas Instruments of Dallas, Tex. Other examples include microaccelerometers, micromotors and gears. Some of these structures include a support member from which another component of the micromachine is suspended, such as a hinge or beam.

The repeated movements of the suspended components require a hinge or beam that is elastic yet robust. The flexibility is required so as to allow the suspended component to move. If the hinge or beam is not robust, it could become permanently twisted in the direction of movement, or be deformed plastically so as to change its dimensions.

Various theories have been proposed to explain this behavior, including microslip of dislocations, heavier oxidation at grain boundaries on one side compared to the other, or even the development of surface films.

The use of alloys of aluminum with nitrogen and other elements to form mixtures of ordered compounds has been proposed. For an example of these types of compounds, reference is made to commonly assigned patent application Ser. No. 5,552,924, entitled "Micromechanical Device Having an Improved Beam." The goal in these types of processes was to develop some type of intermetallic with more slip resistance than face-centered cubic (FCC) crystalline structures. Nitrided aluminum and non-aluminum alloys can also be used to form a metal film from which an elastic member is formed, either as polycrystalline film or amorphous film. An example of these types of compounds is disclosed in the cross-referenced commonly assigned patent application Ser. No. 08/706,374, entitled "Improved Elastic Member for Micromechanical Device." The teachings of both of these patent applications is incorporated herein by reference.

It has been observed using some well known deposition systems that films prepared to function as hinges or beams typically show varying degrees of stress relaxation when strained to 1%. The stress relaxation can be viewed as creep and is a function of the structure and possibly the density of amorphous films. Material with low or no stress relaxation is considered best. Although the recrystallization temperature of these amorphous films increases with nitrogen content, the stress relaxation is not a simple function of nitrogen. Intentionally nitrided films, i.e. whereby nitrogen is added in the sputter gas, has lower stress relaxation when nitrogen gas is increased to 10%, but increased stress relaxation when the nitrogen percentage is increased to 20%.

It is desired to further improve the stress relaxation of $TiAl_3$ amorphous films.

SUMMARY OF THE INVENTION

The present invention achieves technical advantages by intentionally adding oxygen to a $TiAl_3$ film instead of nitrogen, or in combination with nitrogen. Desired oxygen levels are provided while sputter depositing a film of $TiAl_3$, from which film an elastic member such as a hinge or beam is formed. The film can be either amorphous or polycrystalline. Micromechanical devices with little or no creep can be formed with robust hinges or beams. In the preferred embodiment of the present invention, the best film composition for obtaining the lowest stress relaxation is a nitrogen content of less than 1% nitrogen and an oxygen content of about 8%. A 4% oxygen level in the sputter gas achieves an 8% film composition, due to the source of oxygen that is present in a $TiAl_3$ target typically prepared from powders with surface oxides.

It is one advantage of the invention to provide a elastic member with high tensile strength.

It is another advantage of the invention to provide smooth films when deposited.

It is another advantage of the invention in that it provides an elastic member composed of elements which can be easily dry etched.

BRIEF DESCRIPTION OF THE DRAWINGS

For a more complete understanding of the present invention and for further advantages thereof, reference is now made to the following Detailed Description taken in conjunction with the accompanying Drawings in which:

FIG. 5 shows the deposited film stress (load relaxation) of a film formed by reactive sputtering from a $TiAl_3$ target, as a function of the composition of oxygen and nitrogen (if any) in the deposited film.

DETAILED DESCRIPTION OF THE PREFERRED EMBODIMENTS

Figure 1:
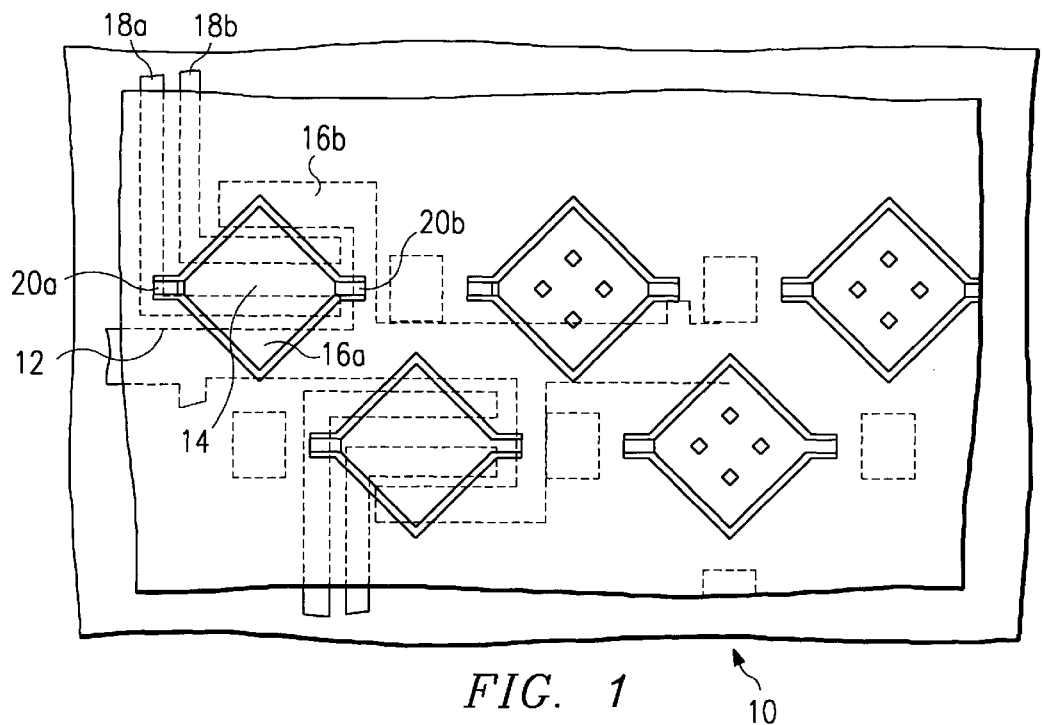
FIG. 1 shows a plan view of a micromechanical device.

A plan view of a portion of a micromechanical spatial light modulator is shown in FIG. 1. An array of such devices is manufactured monolithically on a substrate 10. Each pixel 12 consists of a deflectable mass, in this case a mirror 14, supported on two opposite corners by hinges 20a and 20b. Hinges 20a and 20b are often connected together by a "beam" of metal that is patterned out of the same metal layer used in forming the hinges, upon which the mirror metal is deposited. Underneath the mirror, on the surface of the substrate, are two addressing electrodes, addressed along lines 18a and 18b. The mirror 14 is electrically conductive and held at a certain bias.

When a bias is applied to either electrode 18a or 18b, the mirror is attracted to that electrode by attractive electrostatic forces and deflects towards that electrode. The deflection motion is allowed by the hinges 20a and 20b, which flex or deform to allow the mass of the mirror to move. The mirror moves until it comes to rest on one or the other landing electrodes 16a or 16b, which are held at the same bias as the mirror to prevent current flow.

This example of a micromechanical spatial light modulator is a digital micromirror device (DMD, previously known as a deformable mirror device). However, the nature of the stresses and properties of the hinges and other parts of the mirror that allow the freedom of movement are applicable to all types of micromechanical devices that have elastic members connected moving components anchored to stationary components.

Figure 2:
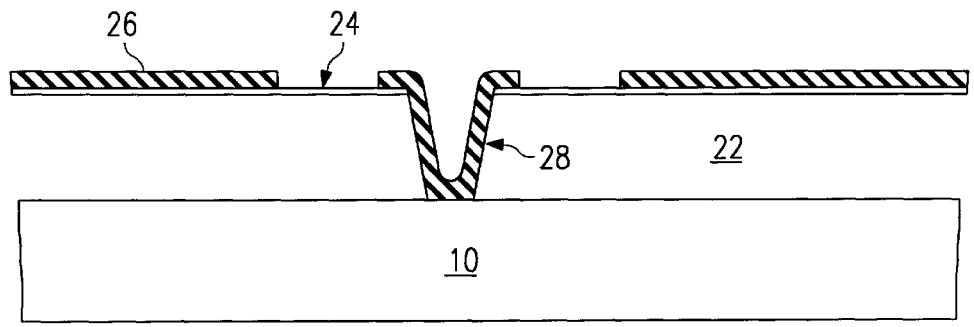
FIG. 2 shows a side view of a micromechanical device during its manufacturing process using aluminum alloy hinges and beams, taken generally along line 2—2 from FIG. 1.

These devices result from a monolithic manufacturing process which is described in greater detail in U.S. Pat. No. 5,061,049, incorporated by reference herein. For discussion purposes the manufacturing process has been simplified. A side view of a device is shown in FIG. 2.

The substrate 10 upon which the arrays of devices are built must first be manufactured with CMOS addressing circuitry. A metal layer, commonly referred to as M3, is then deposited upon the CMOS wafer to form the electrodes. A layer of photoresist is then spun on to act as a spacing material and into which vias are formed. A thin metal film 24 with a thickness of 500–700 angstroms (A) is deposited onto of the spacing material. This thin metal film is then patterned and etched to form hinges and the beam which connects the two hinges for each mirror. A final metal layer is then deposited which nearly completely fills the vias in the spacing material to form support posts 28. This layer is patterned and etched to leave mirrors supported underneath by a beam of metal connected to the hinges, which in turn are connected to the support posts.

In order to allow the mirrors to move freely, the spacing material is etched, typically using a plasma etch, to leave an air gap 22 over which the mirror is suspended. The entire array of devices is manufactured on the wafer, resulting in an array of miniature movable mirrors, each one of which can control a pixel in a displayed or printed image, among other uses. To form an image, for example, each mirror is controlled to either direct light towards a display surface or away from the surface. How much light is directed towards the surface by each mirror determines the brightness of that pixel. By controlling the entire array in that manner the image is formed.

However, this turning of the mirror towards and away from a display surface requires repeated flexing of the hinges in response to the appropriate addressing signals. A non-elastic response in the hinge can be produced by deformation due to slip or by diffusional creep. This can cause the hinges to become permanently flexed or deformed in one direction or the other, resulting in a degraded picture as the mirror will always direct a small portion of the light either towards or away from the screen.

Figure 3A:
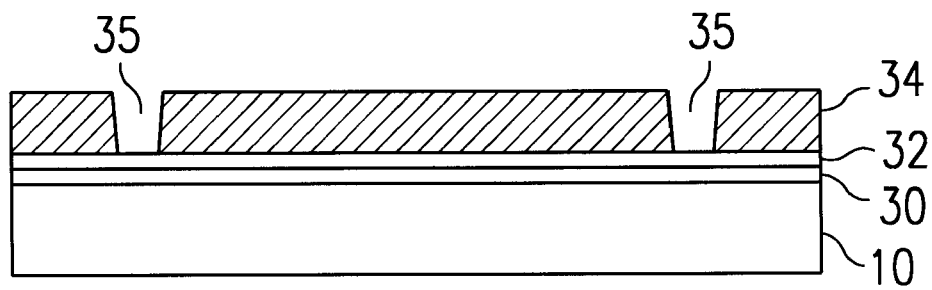
FIGS. 3a–3f show side views of a multi-level micromechanical device during its manufacturing process using aluminum alloy hinges and beams.

The problem exists even in alternate structures such as multi-level DMD devices such as is shown in FIGS. 3a–3f. The multi-level DMD is formed with the same initial steps as the single level DMD. FIG. 3a shows the initial formation of the spacing layer 34 on top of a protective oxide 32 which covers the electrode layer 30. Electrode layer 30 is on the substrate 10. Vias 36 are cut in the spacing layer 34, just as in the single level device.

Figure 3B:
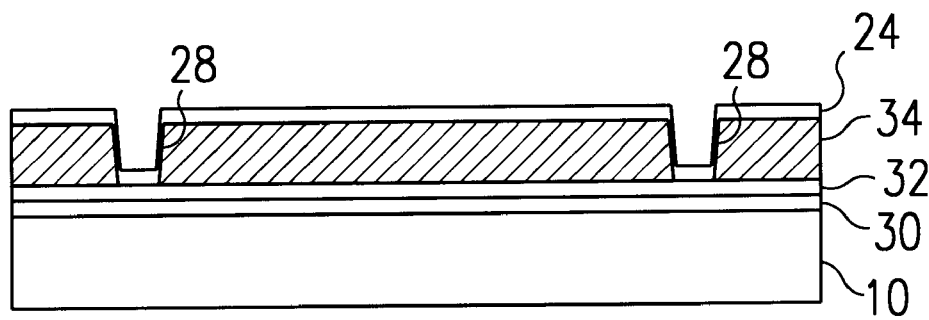
Figure 3C:
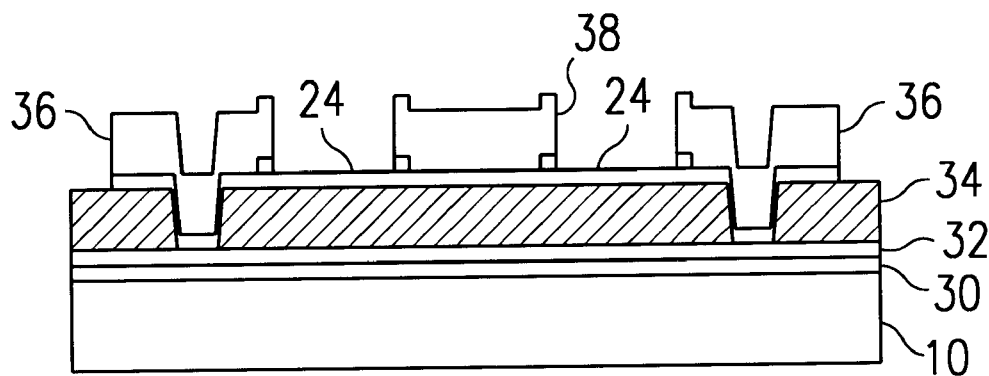

Thin metal film 24 is then deposited as shown in FIG. 3b upon the spacing material and into the vias 35 to form the posts 28. This film will form the hinges and beams of the device just as before, but in this embodiment they will be on the electrically active level of the device, with the mirror being formed one level above them. In the next step, a thicker layer of metal is deposited, patterned and etched to form hinge and post caps 36 and a yoke 38 as shown in FIG. 3c.

Figure 3D:
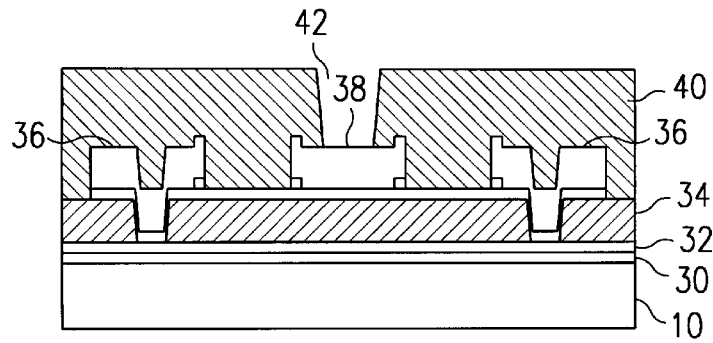
Figure 3E:
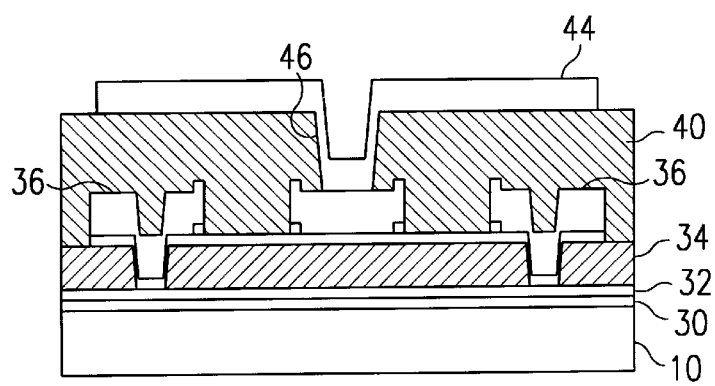
Figure 3F:
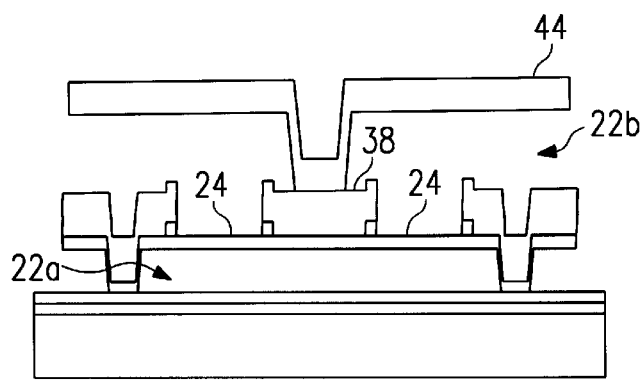

In FIG. 3d, this yoke layer of metal is covered with another layer of spacing material 40. A via 42 is formed in the spacing material directly over the yoke 38. In FIG. 3e, the mirror is shown after the final metal layer has been deposited, patterned and etched to form the mirror 44, which is supported by a post 46 formed in the via. Finally, the spacing material is etched away, leaving gaps 22a between the substrate and the active yoke, and 22b between the active yoke and the mirror, as shown in FIG. 3f. In this embodiment, the hinges and beam metal film 24 still flex to allow the yoke to deflect in either of two directions. When the yoke flexes, the mirror moves as desired. However, the same problems of permanent flex or deformation by creep can occur.

Previous solutions to this load relaxation problem have been sought in the formation of the metal films used for the hinges and beams. The mirror is typically some type of highly reflective aluminum alloy. The beam and hinges have been formed from titanium/tungsten alloys, with and without impurities. An example of these types of alloys can be found in commonly owned U.S. Pat. No. 5,696,619. Additionally, impurities such as nitrogen have been used to strengthen alloys to produce a better resistance to slip, under the theory that the deformation or flexing of the hinges was caused by microslip. Example of these alloys can be found in commonly owned U.S. Pat. No. 5,552,924 and U.S. patent application Ser. No. 08/706,374.

Amorphous material is defined by a lack of long range atomic order or atomic periodicity, such as exhibited by glass. Although there can be short range order between adjacent atoms, the degree of atomic order decreases with distance, so that there is more uncertainty for the position of the third nearest neighbor atoms, and even more uncertainty for the fourth nearest neighbor atoms. Amorphous material can be characterized by a variety of techniques including x-ray diffraction, electron diffraction, transmission electron microscopy (or TEM). The x-ray diffraction spectra for nitrogen-doped titanium aluminide films which are amorphous and polycrystalline are different. The amorphous film exhibits either a single broad peak or no peak at angles of 2θ between about 37° and 42°, while the polycrystalline film show a sharp peak at about the same position and a number of other smaller secondary peaks or second-order reflections. Both X-ray and electron diffraction patterns for amorphous material samples are dominated by one or two diffuse ring patterns with uniform intensity, whereas crystalline materials shows individual spot patterns or rings of spots which are finer in width. TEM micrographs show a layer of uniform contrast which does not change with tilt, and no grain boundaries or dislocations are present.

In the application of the added nitrogen impurities, a crystalline structure was originally assumed to be desirable. However, upon experimentation other structures were found to have several advantages over the non-FCC polycrystalline structure originally desired. Amorphous and nitrided polycrystalline multicomponent alloys other than aluminum or titanium/tungsten were found to be superior.

Using reactive nitriding of the aluminum alloys produces solid solutions, dispersion hardening or amorphous alloys. Reactive nitriding can also be used to produce amorphous alloys with material other than aluminum, for example, by using a silicon-titanium target during sputtering. These alloy modifications appear to produce robust alloy hinges with smaller grain sizes and also appear to be easier to etch than titanium-tungsten-nitrogen hinges previously used.

Using aluminum alloy sputter targets of Al—Si(1%)-Ti (0.2%) and Al—Ti(0.5%), a range of nitrided alloy films were produced with each target using various percentages of nitrogen gas added to argon gas used in sputtering the metal films. In both systems, at low nitrogen percentages of about 10% in the argon sputter gas, the polycrystalline structure appears to be that of a strained Al. These films exhibit much smaller grain sizes ($\approx$100–1000 A) compared to grains in Al films without nitrogen at approximately 1000–10,000 A.

At higher nitrogen percentages, further straining can occur until the crystal structure of Al is no longer predominant and amorphous metal is observed. At very high levels of 50% nitrogen in the sputter gas, films appear to be polycrystalline Al—N as evidenced by coloration due to optical transparency. Grain sizes in these films range between 100–200 A. In the Al—Si(1% at)-Ti(0.2% at) alloy discussed above, the change from the FCC crystal structure to an amorphous crystal structure occurs at about 15% nitrogen in the argon sputter gas, while in the Al—Ti(0.5% at) alloy the change occurs at between 20%–30% nitrogen in the sputter gas. This shift seemingly results from the absence of the 1% Si in the latter alloy.

Low nitrogen alloys sputtered using Al—Si(1% at)-Ti (0.2% at) at about 10% nitrogen in the argon sputter gas produced working DMD devices with fewer defects. One attempt using 22% nitrogen in the sputter gas resulted in the formation of whiskers during the annealing process. Low temperature annealing of nitride aluminum alloys which are amorphous tend to grow whiskers when annealed at 125–200° C., but non-amorphous alloys do not.

To overcome the formation of whiskers with the amorphous alloys, a change was made in the alloy target used for sputtering. A Cerac™ Al—Ti(25 at % Ti) target was used in conjunction with about 10% and 50% nitrogen in the sputter gas. These nitrided alloys are amorphous, including those with higher nitrogen alloy concentrations which appear to be colored and optically transparent. None of these amorphous alloys were observed to form whiskers during annealing for 24 hours at 200°C. Amorphous alloy films were also produced by low temperature deposition using this target without intentional addition of nitrogen. Compositional analysis showed the presence of residual oxygen and nitrogen at levels of about 1–3%. These impurities arise from the powder used in manufacturing the Cerac™ target.

Figure 4:
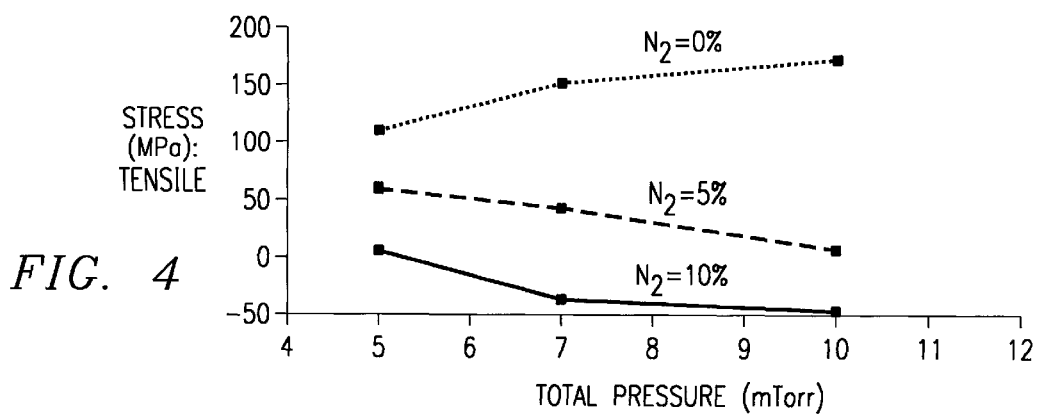
FIG. 4 shows the deposited film stress achieved by reactive sputtering from a $TiAl_3$ target as a function of the total Ar-(N) pressure for several different gas compositions.

Additionally, the tensile strength of these films appears to be improved by making them amorphous since there are no slip planes or dislocations for slip. The sag is controlled by the stress distributions of the Al alloy on the spacing material which can vary with sputter conditions. High compressive stresses in the metal films deposited on the spacing material tends to cause sagging, whereas tensile stresses tends to prevent sagging. By making amorphous films, the tensile strength is increased. Alloys of Al—Ti (25 at % Ti) which are sputtered in argon with 0–10% nitrogen tend to have tensile stresses when deposited on photoresist and usually do not sag. A chart of the stress within the metal film versus the total sputter gas pressure is shown in FIG. 4, with positive values denoting a tensile stress. As can be seen, films with 0–10% nitrogen have little or no compressive stress thereby resulting in a flat hinge.

Sputtered films of $TiAl_3$ typically show residual oxygen and nitrogen levels arising from the powdered targets. This could be reduced by using a cast target. Nitrogen levels in the film can be much high than those in the sputter gas. For example, 10% nitrogen in argon has produced level exceeding 18% at nitrogen in the reactively sputtered film. The exact composition depends upon deposition parameters and conditions.

Therefore, it is desirable to use alloys of $TiAl_3(N)$ containing nitrogen levels between about 0.1–45 at % for use as the mechanical or structural members of devices such as the digital micromirror device or other devices which require elastic connecting members between stationary and moving parts. Fully nitrided alloys are also potentially useful.

It may also be desirable to add impurities to the aluminum nitrogen alloys, such as silicon, boron, germanium, oxygen, or carbon for the covalent bonding so as to help stabilize an amorphous alloy with a possibly higher recrystallization temperature. Additionally, other impurities may be desired such as nickel, zinc, magnesium or titanium, to form intermetallic compounds for strength when materials are polycrystalline. Examples of these compounds are $AlN_y$, $(Al_3Ti)N_y$, $(Al:(SiTi))N$, $(Al:(Q,Z))N_y$, where y can vary between 0 and 1.0 and Q and Z are the impurities listed above.

Additionally, it may be desirable to use amorphous alloys of aluminum and nitrogen (from 0.0–50.0 at % N) and one or more impurities. These amorphous alloys do not have a periodic lattice, are resistant to slip by dislocations, will produce smoother deposited films and have isotropic elastic properties. Further, these alloys may constitute nitrogen and any other impurities excluding aluminum. Examples of these could be TiN, SiN, $(TiSi)N_y$, and $(Ti_xSi_{(1-x)})N_y$, where x and y can vary between 0 and 1. For example, a Ti:Si:N alloy of approximate composition of 1:2:3 was deposited by reactive sputtering from a pure titanium target with overlaid Si which covered about 50% of the Ti target surface and 10% nitrogen in the argon sputter gas.

By controlling the concentrations of nitrogen and titanium, it is possible to set the percentages at which the films become amorphous, as opposed to polycrystalline. Using a target of Al –½% Ti and sputter gas with argon, from 0 to 20% nitrogen, the film is polycrystalline when sputtered using 3 kW power. Between 20–30% nitrogen, the film becomes amorphous. At concentrations levels of nitrogen of over 35%, the film becomes polycrystalline. The concentration of Ti seems to have an inversely proportional affect on the concentration of nitrogen at which the film becomes amorphous. Higher percentages of titanium result in a lower concentration of nitrogen at which the film becomes amorphous.

However, polycrystalline materials seem to be useful as well. Examples of these types of alloys would be Al+AlN as well as AlN, and Al (<15% at N). The polycrystalline alloys may also be formed using the impurities mentioned above. The use of polycrystalline films, while useful, does not seem to be as beneficial as the use of amorphous films for elastic members in micromechanical devices. The amorphous films exhibit higher yield strengths, have isotropic elastic properties and result in smoother deposited films.

Referring now to FIG. 5, there is shown an alternative preferred embodiment of the present invention whereby oxygen gas is present during sputtering of the $TiAl_3$ instead of nitrogen gas, or in combination with nitrogen gas. FIG. 5 shows a composite of the stress relaxation of $TiAl_3$ amorphous films as a function of the combination of oxygen and nitrogen present in the deposited film. It is shown in FIG. 5 that by reducing the nitrogen level and increasing the oxygen level in a sputter gas, a film with reduced stress relaxation is achieved. As illustrated in FIG. 5, although mixtures of oxygen and nitrogen in the film improve the stress relaxation, the best composition for obtaining the lowest stress relaxation was low nitrogen, that is, less than 1%, and oxygen levels at about 8% oxygen in the TiAl$_3$ amorphous film.

To achieve about an 8%–10% oxygen content in the film, 4% oxygen was present in an argon sputter gas. This proportion of oxygen compliments the small source of oxygen that is present in the TiAl$_3$ target, which is typically prepared from powders with surface oxides. Higher levels of oxygen in films which are still metallic are also robust, that is, oxygen contents that are greater than 8%.

FIG. 5 also illustrates the observed results that increasing nitrogen in the sputter gas from 5% to 10%, or to 20%, initially lowers stress relaxation at 10%, but stress relaxation is again increased when 20% nitrogen is used. Again, material with no or low stress relaxation is considered best.

Referring to point A in FIG. 5, it is observed that for no oxygen and no nitrogen in the TiAl$_3$ amorphous film, a load relaxation of about 14% is realized. Increasing the nitrogen content to about 1.6% was observed to lower the load relaxation to about 12%, as shown at point B. At point C, when the nitrogen content is increased to 4%, the load relaxation increases again up to about 15%.

According to the preferred embodiment of the this invention, by increasing the oxygen content, in combination with nitrogen or by totally eliminating nitrogen, the load relaxation in the film is dramatically reduced. It can be seen that at point D, whereby 4% oxygen and 4% nitrogen is present in the TiAl$_3$ amorphous film, a load relaxation of about 7.5% is observed. Now, referring to point E, it can be seen that the load relaxation of the film can be essentially reduced to 0% when 4% oxygen and 0% nitrogen is present in the TiAl$_3$ film. The dramatic reduction in load relaxation in the film derives benefits when the film is formed into hinges and beams of micromechanical devices, such as spatial light modulators including those of the DMD type. With reduced creep in these hinges and beams, the hinges and beams will not tend to sag, and thus, when a device is formed such as the DMD, incident light will not be inadvertently directed into the aperture lens of the display system.

Thus, although there has been described to this point particular embodiments of an improved elastic micromechanical member, it is not intended that such specific references be considered as limitations upon the scope of this invention except in-so-far as set forth in the following claims.

We claim:

1. An improved elastic member for a micromechanical device, said elastic member flexing upon movement of one component of said device, said elastic member comprising:

one or more electrically conductive amorphous aluminum alloys having the general formula TiAl$_w$+O$_x$ wherein w is between 0.1 and 3 and x is greater than 4.0 at %.

2. The improved elastic member of claim 1 wherein x is between 4.0 at % and 10.0 at %.

3. The improved elastic member of claim 1 wherein said amorphous alloy has been formed using a sputter target containing principally Ti and Al as major components, said oxygen added by sputtering said major components in the presence of oxygen.

4. The improved elastic member of claim 1 wherein said amorphous alloy has been formed using an Al:Ti target, having 1 at % to 85 at % Ti.

5. The improved elastic member of claim 3 wherein said amorphous alloy has been formed in the presence of nitrogen and contains nitrogen.

* * * * *

UNITED STATES PATENT AND TRADEMARK OFFICE
CERTIFICATE OF CORRECTION

PATENT NO. : 5,942,054
DATED : August 24, 1999
INVENTOR(S) : John Harold Tregilgas, Richard Lee Knipe, Thomas William Orent, Hidekazu Yoshihara, and Elliot Keith Carpenter It is certified that error appears in the above-indentified patent and that said Letters Patent is hereby corrected as shown below:

Cover Page, insert Item [60] under Related U.S. Application Data

--Provisional Application No. 60/009,089  Dec. 22, 1995.--

Signed and Sealed this

Twentieth Day of March, 2001

Attest:

NICHOLAS P. GODICI

Attesting Officer

Acting Director of the United States Patent and Trademark Office